United States Patent [19]

Yamaguchi

[11] 4,326,095
[45] Apr. 20, 1982

[54] CASING COMPRISING A BARRIER FOR INTERCEPTING ALPHA PARTICLES FROM A SEALING LAYER

[75] Inventor: Teruo Yamaguchi, Nagoya, Japan

[73] Assignee: Narumi China Corporation, Nagoya, Japan

[21] Appl. No.: 107,714

[22] Filed: Dec. 27, 1979

[30] Foreign Application Priority Data

Dec. 28, 1978 [JP] Japan .......................... 53-178552[U]

[51] Int. Cl.³ .............................................. H05K 5/06
[52] U.S. Cl. ................... 174/52 FP; 357/84; 361/424
[58] Field of Search ............... 174/52 FP, 52 H, 52 S, 174/50, 54; 357/84; 361/424

[56] References Cited

U.S. PATENT DOCUMENTS 3,337,678 8/1967 Stelmak ........................... 174/52 FP
3,544,857 12/1970 Byrne et al. ..................... 174/52 FP
3,697,666 10/1972 Wakley et al. .................. 174/52 FP Primary Examiner—B. A. Reynolds
Assistant Examiner—D. A. Tone Attorney, Agent, or Firm—Hopgood, Calimafde, Kalil, Blaustein & Judlowe

[57] ABSTRACT

A casing for a semiconductor memory chip comprises a barrier intercepting a limited space that envelopes lines of vision between an exposed surface of the chip and an inside end surface of a sealing layer for hermetically sealing a cap and a base member of the casing together and at least towards which alpha particles are emitted from the sealing layer inside surface. The barrier may be made integral with a base member peripheral region having a peripheral surface to be sealed to the cap member by the sealing layer, with that mounting surface of the base member on which the chip is attached, recessed relative to the peripheral surface. The peripheral surface may be either parallel to the mounting surface or canted so that the limited space may be directed inwardly away from the mounting surface. Alternatively, the barrier may comprise a pedestal member having a surface that is an outward extension of the mounting surface, with the mounting surface protruded relative to the peripheral surface. As a further alternative, the barrier may comprise a protrusion on at least one of the peripheral surface and a like surface of the cap member, with the protrusion or protrusions inwardly offset relative to the sealing layer inside surface.

10 Claims, 7 Drawing Figures

1

CASING COMPRISING A BARRIER FOR INTERCEPTING ALPHA PARTICLES FROM A SEALING LAYER

BACKGROUND OF THE INVENTION

This invention relates to a casing for a semiconductor memory chip.

It is a recent trend that a great number of memory elements are highly integrated in a single semiconductor memory chip. In order to package such a semiconductor memory chip into a packaged memory device, use is made of a casing comprising a base member and a cap member. With the memory chip mounted on the base member, the cap and the base members are hermetically sealed together by a sealing layer of glass frit to form a hollow space in which the memory chip is placed. It is recently pointed out that soft errors take place in the memory elements of the packaged memory device. This is because alpha particles are emitted from the casing onto the memory elements.

As will later be described with reference to one of several figures of the accompanying drawing, the sealing layer of glass frit occasionally emits objectionable alpha particles onto the memory chip. In addition, the soft errors are often dependent on the alpha particles emitted from the cap member.

SUMMARY OF THE INVENTION

It is an object of this invention to provide a casing for a semiconductor memory chip, by which it is possible to avoid occurrence of soft errors in memory elements of the memory chip.

It is another object of this invention to provide a casing of the type described, which may emit alpha particles and yet is capable of preventing those alpha particles from reaching the semiconductor memory chip which give rise to soft errors.

It is a specific object of this invention to provide a casing of the type described, wherein the semiconductor memory chip is sheltered from the alpha particles emitted from a layer of sealing glass used in the casing.

It is another specific object of this invention to provide a casing of the type described, which is capable of preventing the alpha particles from reaching the semiconductor memory chip from a cap member of the casing.

A casing to which this invention is applicable is for a semiconductor memory chip having a first surface and a second surface opposite the first surface. The casing comprises a base member and a cap member. The base member has a peripheral region having a peripheral surface, a mounting region having a mounting surface, and a region intermediate between the peripheral and the mounting regions. The cap member has a cap member peripheral surface to be hermetically sealed to the base member peripheral surface by an intermediary of a sealing layer to form a hollow space in the casing with the memory chip attached in the hollow space to the mounting surface at the second surface. The sealing layer has an inside end surface directed towards the hollow space and emitting alpha particles from the inside end surface at least towards a limited space enveloping lines of vision of viewing the inside end surface and the first surface from one to the other. According to this invention, the casing comprises a barrier placed in the hollow space between the first and the inside end surfaces. The barrier is made to intercept the limited space.

DESCRIPTION OF THE PREFERRED EMBODIMENTS

Figure 1:
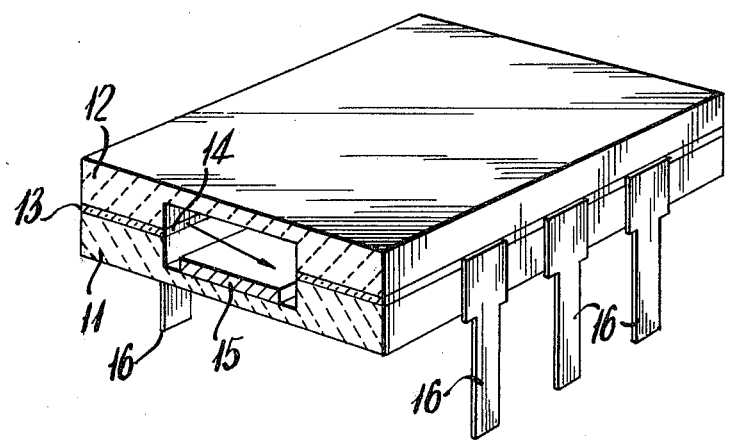
FIG. 1 shows a perspective view of a conventional casing together with a semiconductor memory chip and conductive leads attached to the casing, with a portion cut away.

Referring to FIG. 1, a conventional casing for a semiconductor memory chip will be described for a better understanding of this invention. The casing comprises a base member 11 and a cap member 12 both of which are of a ceramic material. The base member 11 has a peripheral region having a peripheral surface, a mounting region having a mounting surface to be described later, and a region intermediate between the peripheral and the mounting surfaces. The cap member 12 has a cap member peripheral region having a cap member peripheral surface and a center region having a center surface surrounded by and offset relative to the cap member peripheral surface. A sealing layer 13 of glass frit is laid between the peripheral surfaces of the base and the cap members 11 and 12 to be used as an intermediary for hermetically sealing the base member 11 with the cap member 12 and to form a hollow space in the casing. The sealing layer 13 has an inside end surface 14 directed towards and exposed to the hollow space. A semiconductor memory chip 15 is mounted on the mounting surface of the base member 11 with an upper surface of the memory chip 15 facing the hollow space and with a lower surface thereof attached to the mounting surface. A great number of memory elements, such as dynamic RAMs and CCDs, are formed as an integrated circuit adjacent to the upper surface of the memory chip 15. A plurality of conductive leads 16 are electrically connected to the memory chip 15 by the use of thin conductors (not shown) and are accessibly disposed along an external end surface of the base member 11 through the layer 13 of glass frit.

With the conventional casing, the semiconductor memory chip 15 is exposed to alpha particles emitted from the sealing layer 13 of glass frit and the cap member 12 of ceramic material. As a result, soft errors take place in the memory elements integrated in the memory chip 15. The inventor found out that the glass frit is stronger in intensity of the alpha particles than the ceramic material. For example, measurement by the use of a scintillation alpha counter shows that the ceramic material has intensity of the alpha particles between 1.78 and 0.04 (particles/(cm$^2$hr)) while the glass frit has an intensity between 60.0 and 2.0 (particles/(cm$^2$hr)). A reduction is, therefore, possible of the soft errors when no alpha particles reach the memory chip 15 from the sealing layer 13. It should be pointed out in this connection that the alpha particles are emitted from the inside end surface 14 of the sealing layer 13 at least towards a limited space enveloping lines of vision (only one being indicated by an arrow-headed line in FIG. 1) of viewing the inside end surface and the upper surface of the chip 15 from one to the other.

Figure 2:
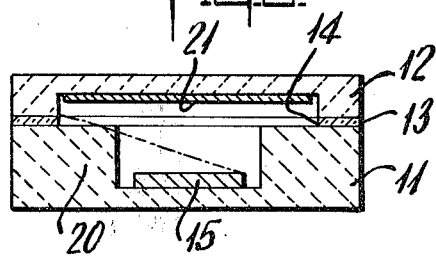
FIG. 2 shows a sectional view of a casing according to a first embodiment of this invention with a semiconductor memory chip attached thereto.

Referring now to FIG. 2, a casing according to a first embodiment of this invention comprises a base member 11 and a cap member 12, like in FIG. 1. The casing comprises, as a barrier, an edge member 20 in the intermediate region of the base member 11. In the example being illustrated, the edge member 20 is made integral with the base member peripheral region and has a barrier surface contiguous to the base member peripheral surface and parallel to the mounting surface. In other words, the barrier surface is an inward extension of the base member peripheral surface. The mounting surface is recessed relative to the barrier surface. Thus, a recessed surface is formed by a combination of the mounting surface and that surface of the intermediate region which is an outward extension of the mounting surface. The edge member 20 has an internal wall surface that is contiguous to the barrier and the recessed surfaces. The edge member 20 serves to intercept the alpha particles emitted towards the limited space. The lines of vision are exemplified by a single broken line. Practically, the barrier surface is 3 mm wide, the internal wall surface is 1.5 mm high, and the recessed surface is 5 mm wide when the chip 15 is 200 microns thick and 3 mm wide and the sealing layer 13 is 500 microns thick.

Preferably, the center surface of the cap member 12 is covered with a protection layer 21 against alpha particles emitted from the cap member 12. The protection layer 21 may be of a material and a thickness for preventing the alpha particles from being emitted onto the memory chip 15. Specifically, the material may be selected from a group of silicon of high purity, Kovar, 42 alloy, and silver. The thickness may be equal to 53, 20.9, 21.5, and 23.1 microns when each of the silicon, Kovar, 42 alloy, and silver is used as the material, respectively.

Figure 3:
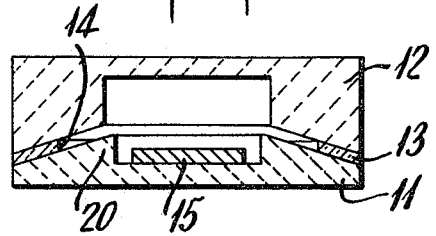
FIG. 3 shows a similar sectional view of a casing according to a modification of the first embodiment of this invention.

Referring to FIG. 3, a casing according to a modification of the first embodiment of this invention comprises, as a barrier, an edge member 20 having a barrier surface which is an inward extension of the base member peripheral surface, like in FIG. 2. The base member peripheral surface forms an angle with the mounting surface. The angle renders the base member peripheral region thicker at portions nearer to the intermediate region. The barrier surface is, therefore, canted with an inner edge farthest projected into the hollow space. Thus, the mounting surface is recessed relative to the barrier surface. A cap member 12 is hermetically sealed at the cap member peripheral surface to the base member 11 by a sealing layer 13 of glass frit, as is the case with the casing illustrated in FIG. 2. Like the base member peripheral surface, the cap member peripheral surface is canted to mate with the base member peripheral surface 12. A semiconductor memory chip 15 is mounted on the mounting surface. The inside end surface 14 of the sealing layer 13 lies behind the barrier surface of the edge member 20 and is hidden from the lines of vision from the inner end surface to the upper surface of the memory chip 15. As a result, the edge member 20 serves to intercept the limited space as described with reference to FIG. 2.

Figure 4:
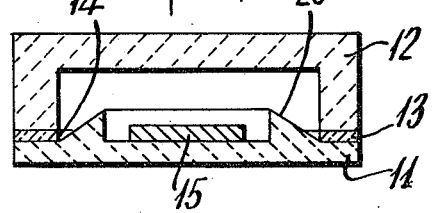
FIG. 4 shows a similar sectional view of a casing according to another modification of the first embodiment of this invention.

Referring to FIG. 4, a casing according to another modification of the first embodiment of this invention comprises a base member 11 having the base member peripheral surface parallel to the mounting surface, like in FIG. 2. The base member 11 is provided as a barrier with an edge member 20 having a barrier surface contiguous to an inner edge of the base member peripheral surface. The barrier surface forms an angle with the mounting surface such that an inner edge of the barrier surface is farther protruded than an outer end of the barrier surface. A cap member 12 has a flat peripheral surface to be hermetically sealed to the base member peripheral surface. In the example being illustrated, the edge member 20 blocks alpha particles emitted towards the limited space as described with reference to FIGS. 2 and 3.

Figure 5:
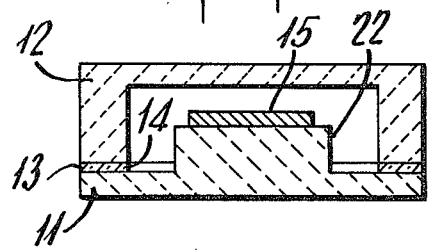
FIG. 5 shows a similar sectional view of a casing according to a second embodiment of this invention.

Referring to FIG. 5, a casing according to a second embodiment of this invention comprises a base member 11 and a cap member 12, like in FIGS. 2, 3, and 4. A sealing layer 13 of glass frit is laid between peripheral surfaces of the base and the cap members 11 and 12. A barrier comprises a pedestal member 22 in the intermediate region of the base member 11. The pedestal member 22 has a pedestal surface which is an outward extension of the mounting surface of the base member 11 and protruded into the hollow space relative to the base member peripheral surface. A semiconductor memory chip 15 is attached to the mounting surface of the base member 11. As readily understood from FIG. 5, the pedestal member 22 is situated between the inside end surface 14 of the sealing layer 13 and the upper surface of the memory chip 15 so that the pedestal member 22 is made to intercept the limited space as described with reference to FIGS. 2 through 4.

Figure 6:
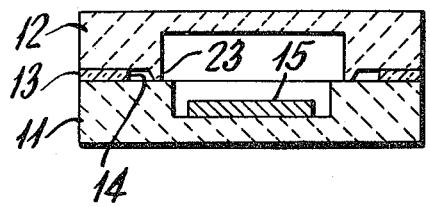
FIG. 6 shows a like sectional view of a casing according to a third embodiment of this invention.

Referring to FIG. 6, a casing according to a third embodiment of this invention comprises a barrier formed on a cap member 12 in this example. A portion of the cap member peripheral surface is inwardly extended into the hollow space relative to an inside end surface 14 of a sealing layer 13. The barrier comprises a protrusion 23 along the above-mentioned portion of the cap member peripheral surface. The protrusion 23 serves to intercept the limited space as described before and, therefore, to block alpha particles emitted towards a memory chip 15 from the inside end surface 14.

Figure 7:
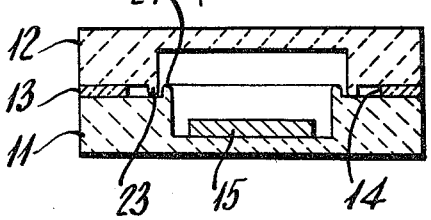
FIG. 7 shows a similar sectional view of a casing according to a modification of the third embodiment of this invention.

Finally referring to FIG. 7, a casing according to a modification of the third embodiment of this invention comprises a barrier comprising a protrusion 23 along the above-specified portion of the cap member peripheral surface. A similar portion of the base member peripheral surface is inwardly extended relative to the inside end surface. The barrier further comprises an additional protrusion 24 along the similar portion of the base member peripheral surface. The protrusions 23 and 24 serve to intercept a limited space described before.

While several embodiments of this invention have so far been described, it is now readily possible for those skilled in the art to put this invention into practice in various manners. For example, the protection layer 21 as illustrated in FIG. 2 may be attached to each of the cap members shown in FIGS. 3 through 7. The barrier surface shown in FIG. 4 may be offset relative to the base member peripheral surface with the barrier surface parallel to the mounting surface. In FIG. 5, the base member peripheral surface may be canted with an inner edge least projected. In FIG. 6, the protrusion 23 may be projected away from a portion of the base member peripheral surface. The edge or pedestal member may be individually prepared to be attached to the base member by the use of an adhesive.

What is claimed is:

1. A casing for a semiconductor memory chip having a first surface and a second surface opposite said first surface, wherein said casing comprises a base member and a cap member;

said base member having a peripheral region having a peripheral surface, a mounting region having a mounting surface, and an intermediate region between said peripheral and said mounting regions;

said cap member having a cap-member peripheral surface, and a sealing layer interposed between said peripheral surfaces and hermetically sealing said members to each other at said peripheral surfaces;

at least one of said members being recessed and defining with the other of said members a hollow space over said mounting and intermediate regions and hermetically closed by said sealing layer;

at least one semiconductor memory chip being mounted on said mounting surface with said first surface exposed to said hollow space and said second surface attached to said mounting surface;

said sealing layer having an inside end surface exposed toward said hollow space and emitting alpha particles from said inside end surface at least toward a limited space enveloping imaginary lines of vision of viewing said inside end surface and said first surface from one to the other;

the improvement in which a barrier is an integral formation of at least one of said members in interposed relation between said inside end surface and said first surface, said barrier extending peripherally continuously into said limited space and intercepting said imaginary lines of vision.

2. A casing as claimed in claim 1, wherein said barrier comprises a pedestal within said intermediate region, said pedestal having a pedestal surface that is an outward extension of said mounting surface and protruded into said hollow space beyond said base member peripheral surface, to an extent such that said pedestal intercepts said limited space.

3. A casing as claimed in claim 2, wherein said base member peripheral surface is parallel to said mounting surface.

4. A casing for a semiconductor memory chip having a first surface and a second surface opposite said first surface, wherein said casing comprises a base member and a cap member;

said base member having a peripheral region having a peripheral surface, a mounting region having a mounting surface, and an intermediate region between said peripheral and said mounting regions;

said cap member having a cap-member peripheral surface, and a sealing layer interposed between said peripheral surfaces and hermetically sealing said members to each other at said peripheral surfaces;

at least one of said members being recessed and defining with the other of said members a hollow space over said mounting and intermediate regions and hermetically closed by said sealing layer;

at least one semiconductor memory chip being mounted on said mounting surface with said first surface exposed to said hollow space and said second surface attached to said mounting surface;

said sealing layer having an inside end surface exposed toward said hollow space and emitting alpha particles from said inside end surface at least toward a limited space enveloping imaginary lines of vision of viewing said inside end surface and said first surface from one to the other;

the improvement in which a barrier is an integral formation of said base member, said barrier comprising an edge formation contiguous to said base-member peripheral surface and having an inner edge extending peripherally continuously into said limited space and intercepting said imaginary lines of vision.

5. A casing as claimed in claim 4, said base member peripheral surface being parallel to said mounting surface, and said barrier being an inward extension of said base member peripheral surface.

6. A casing as claimed in claim 4, wherein said base member peripheral surface forms an angle with said mounting surface, said angle rendering said peripheral region thicker at portions nearer to said intermediate region, said barrier being an inward extension of said base member peripheral surface.

7. A casing as claimed in claim 4, wherein said base member peripheral surface is parallel to said mounting surface, and said barrier includes a surface which forms an angle with said mounting surface such that said inner edge is farther protruded into said hollow space than where said barrier surface is substantially contiguous to said base member peripheral surface.

8. A casing for a semiconductor memory chip having a first surface and a second surface opposite said first surface, wherein said casing comprises a base member and a cap member;

said base member having a peripheral region having a peripheral surface, a mounting region having a mounting surface, and an intermediate region between said peripheral and said mounting regions;

said cap member having a cap-member peripheral surface, and a sealing layer interposed between said peripheral surfaces and hermetically sealing said members to each other at said peripheral surfaces;

at least one of said members being recessed and defining with the other of said members a hollow space over said mounting and intermediate regions and hermetically closed by said sealing layer;

at least one semiconductor memory chip being mounted on said mounting surface with said first surface exposed to said hollow space and said second surface attached to said mounting surface;

said sealing layer having an inside end surface exposed toward said hollow space and emitting alpha particles from said inside end surface at least toward a limited space enveloping imaginary lines of vision of viewing said inside end surface and said first surface from one to the other;

the improvement in which a barrier is an integral protrusion on the peripheral surface of one of said casing members along that portion of the last-mentioned periperal surface which is inwardly offset relative to said sealing layer inside end surface, said protrusion intercepting said limited space.

9. A casing as claimed in claim 8, wherein said barrier further comprises an additional protrusion on the other peripheral surface along that portion of the other peripheral surface which is inwardly offset relative to said sealing layer inside end surface and is in nested offset relation to said first-mentioned protrusion, said additional protrusion intercepting said limited space.

10. A casing as claimed in claims 1, 2, 3, 5, 6, 7, 8, or 9, wherein said cap member comprises a center surface facing said first surface and surrounded by said cap member peripheral surface, said center surface emitting alpha particles into said hollow space, and wherein said casing comprises a protection layer on said center surface, said protection layer being of a material and a thickness for preventing the last-mentioned alpha particles from being emitted onto said memory element.

* * * * *